United States Patent
Liu et al.

(10) Patent No.: US 10,056,356 B1
(45) Date of Patent: Aug. 21, 2018

(54) CHIP PACKAGE CIRCUIT BOARD MODULE

(71) Applicant: Unimicron Technology Corp., Taoyuan (TW)

(72) Inventors: Wen-Fang Liu, Taoyuan (TW); Shao-Chien Lee, Taipei (TW); Chen-Wei Tseng, New Taipei (TW); Zong-Hua Li, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/585,166

(22) Filed: May 3, 2017

(51) Int. Cl.
*H01L 25/075* (2006.01)
*H01L 23/498* (2006.01)

(52) U.S. Cl.
CPC .... *H01L 25/0753* (2013.01); *H01L 23/49811* (2013.01)

(58) Field of Classification Search
CPC .............. H01L 25/0753; H01L 23/49811
See application file for complete search history.

(56) References Cited

U.S. PATENT DOCUMENTS

| | | | |
|---|---|---|---|
| 2012/0181574 A1* | 7/2012 | Nakabayashi | H01L 33/486 257/99 |
| 2012/0181678 A1* | 7/2012 | Groenhuis | H01L 21/4842 257/676 |
| 2013/0127034 A1* | 5/2013 | Hasegawa | H01L 23/047 257/676 |

FOREIGN PATENT DOCUMENTS

| | | |
|---|---|---|
| CN | 102102862 | 6/2011 |
| CN | 104538391 | 4/2015 |

* cited by examiner

*Primary Examiner* — Steven Loke
*Assistant Examiner* — Juanita Rhodes
(74) *Attorney, Agent, or Firm* — JCIPRNET

(57) ABSTRACT

A chip package circuit board module includes a circuit board and an original chip. The circuit board includes a first pad and a second pad disposed besides the first pad and separated from the first pad. The original chip is connected to the first pad and the second pad. A width of the original chip is W1, a total width of the first pad is P1, and a total width of the second pad is P2. The total width P1 of the first pad is larger than twice of the width W1 of the original chip, and the total width P2 of the second pad is larger than twice of the width W1 of the original chip.

8 Claims, 4 Drawing Sheets

CHIP PACKAGE CIRCUIT BOARD MODULE

BACKGROUND OF THE INVENTION

Field of the Invention

The invention relates to a circuit board module, and particularly relates to a chip package circuit board module.

Description of Related Art

Generally, a circuit board module of a light-emitting diode (LED) chip is to package the LED chip on a circuit board. However, when the LED chip is damaged, the package is failed, or the LED chip cannot emit light due to other reasons, it is required to disassemble the LED chip to clean pads on the circuit board, and sometimes re-soldering is required, and then a new LED chip is packaged.

However, the aforementioned rework process probably encounters following problems: when the LED chip is stripped, copper lines on a surface of the circuit board are probably stripped together; a high temperature is probably applied during the process of stripping the LED chip, though under a high temperature environment, the circuit board may have unexpected expansion or shrink, which probably damages the circuit board, such that reliability of the circuit board is decreased; when the LED chip is stripped, the pads on the circuit board are probably damaged, and the new LED chip packaged at the same position probably has a problem of yield reduction.

SUMMARY OF THE INVENTION

The invention is directed to a chip package circuit board module, where a substitution chip is adapted to be quickly and easily configured on the circuit board to achieve a high yield.

The invention provides a chip package circuit board module including a circuit board and an original chip. The circuit board includes a first pad and a second pad. The second pad is disposed besides the first pad and separated from the first pad. The original chip is connected to the first pad and the second pad. A width of the original chip is W1, a total width of the first pad is P1, and a total width of the second pad is P2. The total width P1 of the first pad is larger than twice of the width W1 of the original chip, and the total width P2 of the second pad is larger than twice of the width W1 of the original chip.

In an embodiment of the invention, the total width P1 of the first pad and the total width P2 of the second pad are respectively between 2.1 and 2.5 times of the width W1 of the original chip.

In an embodiment of the invention, the chip package circuit board module further includes N substitution chips, which are connected to the first pad and the second pad in parallel with the original chip, where N≥1, a width of each of the substitution chips is W2, and a distance between the original chip and the closest substitution chip is D, then P1≥W1+N(W2+D), and P2≥W1+N(W2+D).

In an embodiment of the invention, the distance D between the original chip and the closest substitution chip is between 0.1 and 0.5 times of the width W1 of the original chip.

In an embodiment of the invention, the first pad includes a plurality of first branch portions connected to each other, and the second pad includes a plurality of second branch portions connected to each other, a position where the original chip is connected to the first pad is one of the first branch portions, and a position where the original chip is connected to the second pad is one of the second branch portions, the total width P1 of the first pad is a sum of widths of the first branch portions, and the total width P2 of the second pad is a sum of widths of the second branch portions.

In an embodiment of the invention, the chip package circuit board module further includes a substitution chip connected to another one of the first branch portions and another one of the second branch portions.

In an embodiment of the invention, the second pad includes a plurality of second branch portions connected to each other, a position where the original chip is connected to the second pad is one of the second branch portions, and the total width P2 of the second pad is a sum of widths of the second branch portions.

In an embodiment of the invention, the chip package circuit board module further includes a substitution chip connected to the first pad and another one of the second branch portions.

According to the above description, in the chip package circuit board module of the invention, by designing the total width P1 of the first pad of the circuit board to be greater than twice of the width W1 of the original chip, and designing the total width P2 of the second pad to be greater than twice of the width W1 of the original chip, when the original chip cannot work, the substitution chip can be directly configured beside the original chip to connect the first pad and the second pad. Namely, the first pad and the second pad respectively preserve a width for connecting the substitution chip. In this way, it is unnecessary to disassemble the original chip during rework, and working procedure of the rework is effectively simplified.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
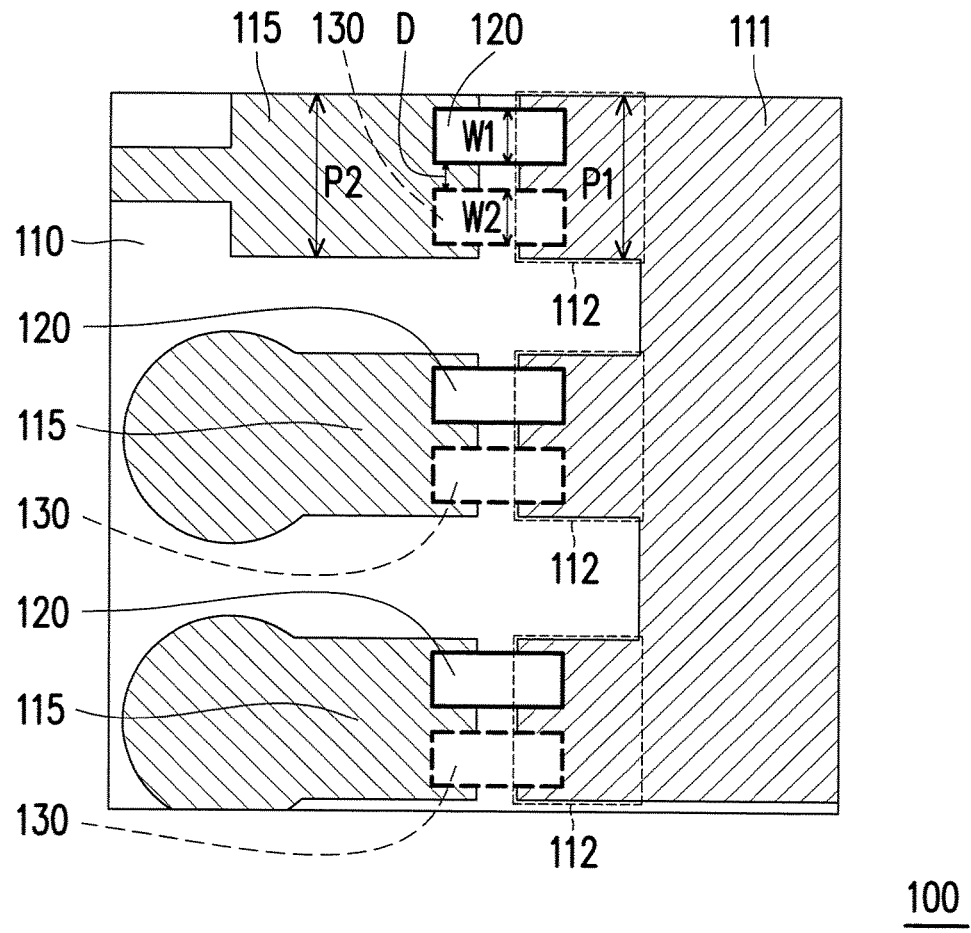
FIG. 1 is a schematic diagram of a chip package circuit board module according to an embodiment of the invention.

FIG. 1 is a schematic diagram of a chip package circuit board module according to an embodiment of the invention. Referring to FIG. 1, the chip package circuit board module 100 of the present embodiment includes a circuit board 110 and a plurality of original chips 120. The circuit board 110 includes a plurality of first pads 112 and a plurality of second pads 115. In the present embodiment, the original chips 120 are, for example, light-emitting diode (LED) chips, though the type of the original chips 120 is not limited thereto. Moreover, in the present embodiment, numbers of the original chips 120, the first pads 112 and the second pads 115 are, for example, respectively three, though the numbers of the original chips 120, the first pads 112 and the second pads 115 are not limited thereto. According to FIG. 1, the first pads 112 are connected through a connection portion 111, though in other embodiments, the first pads 112 can also be separated from each other according to an actual requirement.

The second pads 115 are respectively disposed besides the first pads 112 and separated from the first pads 112. As shown in FIG. 1, each of the original chips 120 is connected to the corresponding first pad 112 and the corresponding second pad 115, where a width of the original chip 120 is W1, a width of the first pad 112 is P1, and a width of the second pad 115 is P2. According to FIG. 1, it is known that the width P1 of the first pad 112 is larger than twice of the width W1 of the original chip 120, and the width P2 of the second pad 115 is larger than twice of the width W1 of the original chip 120.

Under some states, if the original chip 120 cannot work, the chip package circuit board module 100 requires to be repaired. In the present embodiment, the first pad 112 and the second pad 115 respectively preserve a width for connecting a substitution chip 130. Therefore, during the maintenance, the original chip 120 is unnecessary to be disassembled, and a maintenance man may directly allocates the substitution chip 130 beside the original chip 120 for connecting the first pad 112 and the second pad 115, so as to effectively simplify a working procedure of the rework.

In the present embodiment, the chip package circuit board module 100 may include the substitution chips 130, which are connected to the first pads 112 and the second pads 115 in parallel with the original chips 120. In FIG. 1, in order to schematically indicate a width relationship of the first pads 112, the second pads 115 and the original chips 120, the original chips 120 are indicated by solid lines, and the substitution chips 130 are indicated by dot lines. Therefore, in FIG. 1, the number of the substitution chips 130 can be the same to the number of the original chips 120. Namely, each of the first pads 112 and each of the second pads 115 used for electrically connecting the original chip 120 preserve a position for connecting the substitution chip 130.

Moreover, the positions preserved by the first pad 112 and the second pad 115 for connecting the substitution chips 130 in the future can be more than one. For example, the positions preserved by the first pad 112 and the second pad 115 for connecting the substitution chips 130 in the future can be two or more. The width P1 of the first pad 112 and the width P2 of the second pad 115 can be adjusted according to the number of the substitution chips 130 to be connected to the first pad 112 and the second pad 115.

If the number of the substitution chips 130 to be connected to the first pad 112 and the second pad 115 is N, where N≥1, the width of each of the substitution chips 130 is W2. A chip implanting distance has to be preserved between every two adjacent chips to facilitate operation and avoid friction of the two chips, and it is assumed that a distance between the original chip 120 and the closest substitution chip 130 is D, then P1≥W1+N(W2+D), and P2≥W1+N(W2+D). Namely, the width P1 of the first pad 112 is greater than or equal to the width W1 of the original chip 120 plus N times a sum of the width W2 of the substitution chip 130 that can be connected in the future and the distance D between two adjacent chips. Similarly, the width P2 of the second pad 115 is greater than or equal to the width W1 of the original chip 120 plus N times a sum of the width W2 of the substitution chip 130 that can be connected in the future and the distance D between two adjacent chips.

In the present embodiment, the distance D between the original chip 120 and the closest substitution chip 130 is between 0.1 and 0.5 times of the width W1 of the original chip or the width W2 of the substitution chip 130. Therefore, regarding the width P1 of the first pad 112 and the width P2 of the second pad 115 that are suitable for connecting only one substitution chip 130, the width P1 of the first pad 112 and the width P2 of the second pad 115 can be respectively between 2.1 and 2.5 times of the width W1 of the original chip 120. Certainly, a designer may adjust a magnitude of the distance D according to an actual requirement and a spatial configuration on the circuit board 110, and the magnitude of the distance D is not limited thereto.

It should be noted that in FIG. 1, although the circuit board 110 respectively has three sets of the first pads 112 and the second pads 115 located on the top, the bottom and in the middle, and the widths of the first pads 112 of different sets are the same, and the widths of the second pads 115 of different sets are the same, in other embodiments, the widths of the first pads 112 of different sets can also be different, and the widths of the second pads 115 of different sets can also be different.

The chip package circuit board modules of other patterns are described below, and it should be noted that in the following embodiment, the components that are the same or similar with that of the aforementioned embodiment are denoted by the same referential numbers, and details thereof are not repeated, and only differences between different embodiments are described.

Figure 2:
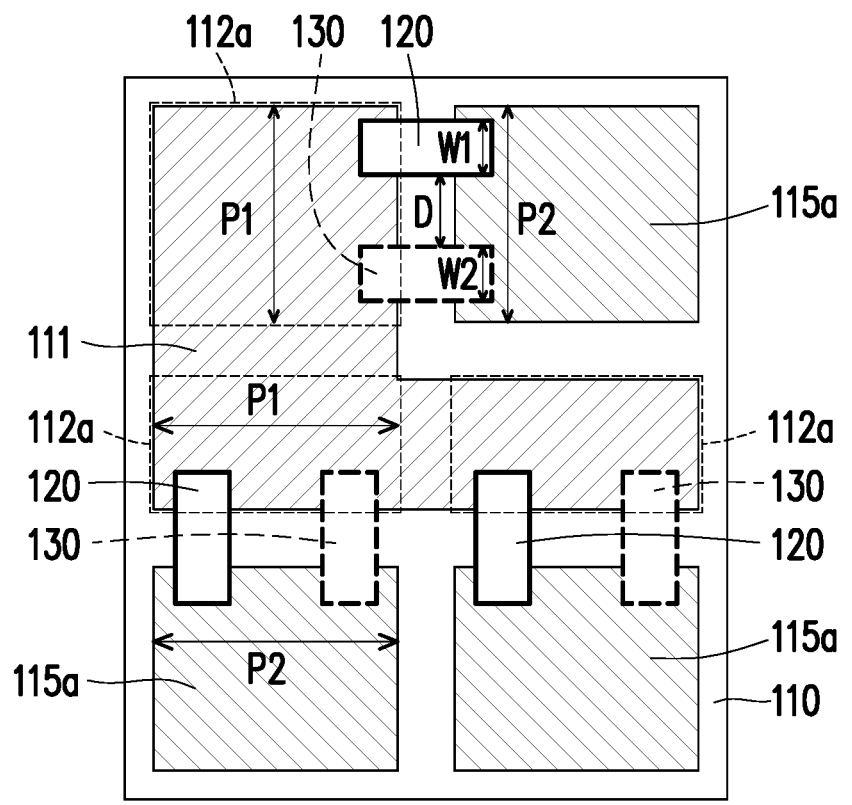
FIG. 2 is a schematic diagram of a chip package circuit board module according to another embodiment of the invention.

FIG. 2 is a schematic diagram of a chip package circuit board module according to another embodiment of the invention. Referring to FIG. 2, a main difference between the chip package circuit board module 100a of FIG. 2 and the chip package circuit board module 100 of FIG. 1 is that shapes and configuration positions of the first pads 112a and the second pads 115a of the present embodiment are different. Similarly, in the chip package circuit board module 100a of the present embodiment, the first pad 112a of the circuit board 110 adopts the width P1 that is greater than twice of the width W1 of the original chip 120, and the second pad 115a adopts the width P2 that is greater than twice of the width W1 of the original chip 120, and when the original chip 120 cannot work, it is unnecessary to disassemble the original chip 120, but the substitution chip 130 can be directly connected to the first pad 112a and the second pad 115a to substitute the original chip 120 to work as long as the first pad 112a and the second pad 115a preserve enough widths P1 and P2, and the shapes and configuration positions of the first pads 112a and the second pads 115a are not limited thereto.

Figure 3:
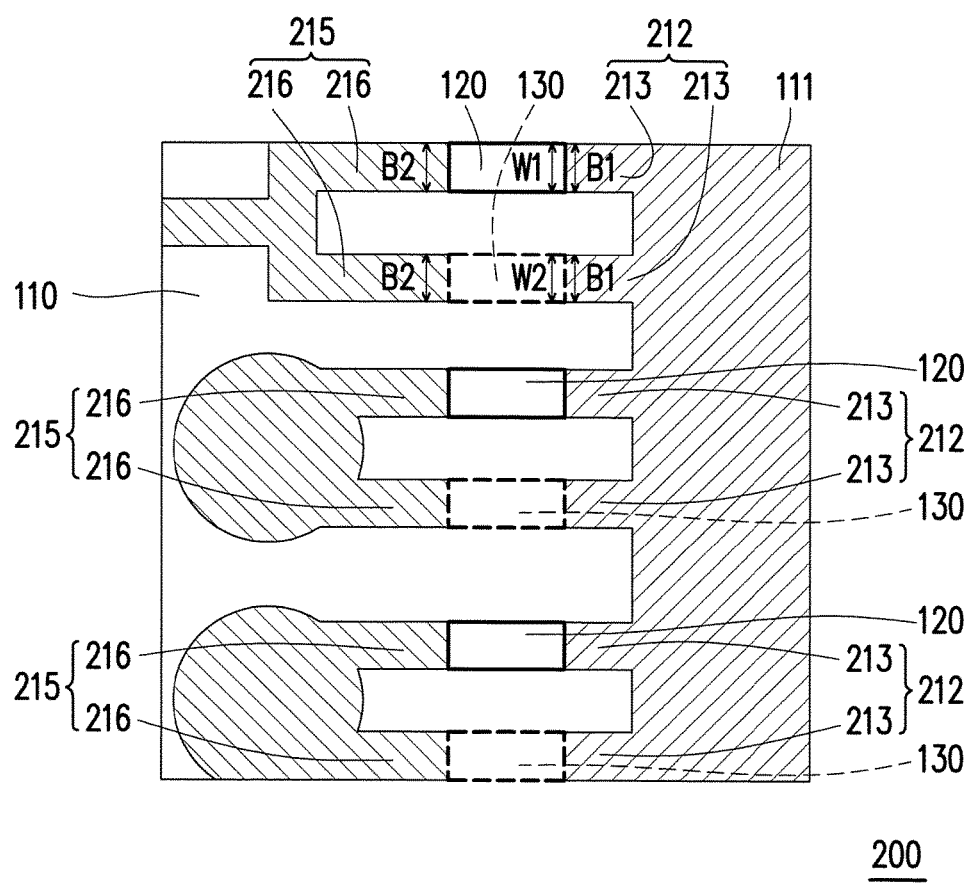
FIG. 3 is a schematic diagram of a chip package circuit board module according to another embodiment of the invention.

FIG. 3 is a schematic diagram of a chip package circuit board module according to another embodiment of the invention. Referring to FIG. 3, three sets of the first pads 212 and the second pads 215 located on the top, the bottom and in the middle are illustrated, and a main difference between the chip package circuit board module 200 of FIG. 3 and the chip package circuit board module 100 of FIG. 1 is that in the present embodiment, each of the first pads 212 includes a plurality of first branch portions 213 connected to each other, and each of the second pads 215 includes a plurality of second branch portions 216 connected to each other. A total width of the first pad 212 is a sum of widths B1 of the first branch portions 213, and a total width of the second pad 215 is a sum of widths B2 of the second branch portions 216.

The width 131 of each of the first branch portions 213 and the width B2 of each of the second branch portions 216 are greater than or equal to the width W1 of the original chip 120, and are greater than or equal to the width W2 of the substitution chip 130.

To be more specific, in the three sets of the first pads 212 of FIG. 3, each of the first pads 212 includes two first branch portions 213 connected to each other, and each of the second pads 215 includes two second branch portions 216 connected to each other. A position where the original chip 120 is connected to the first pad 212 is one of the first branch portions 213, and a position where the original chip 120 is connected to the second pad 215 is one of the second branch portions 216, and when the original chip 120 cannot work, it is unnecessary to disassemble the original chip 120, but the substitution chip 130 can be directly connected to another first branch portion 213 and another second branch portion 216. Certainly, the number of the first branch portions 213 of each first pad 212 is not limited to two, and the number of the second branch portions 216 of each second pad 215 is neither limited to two, and in other embodiments, the number of the first branch portions 213 of each first pad 212 and the number of the second branch portions 216 of each second pad 215 can be three or more, which is determined by a space on the circuit board 110 and the number of the substitution chips 130 to be preserved.

Figure 4:
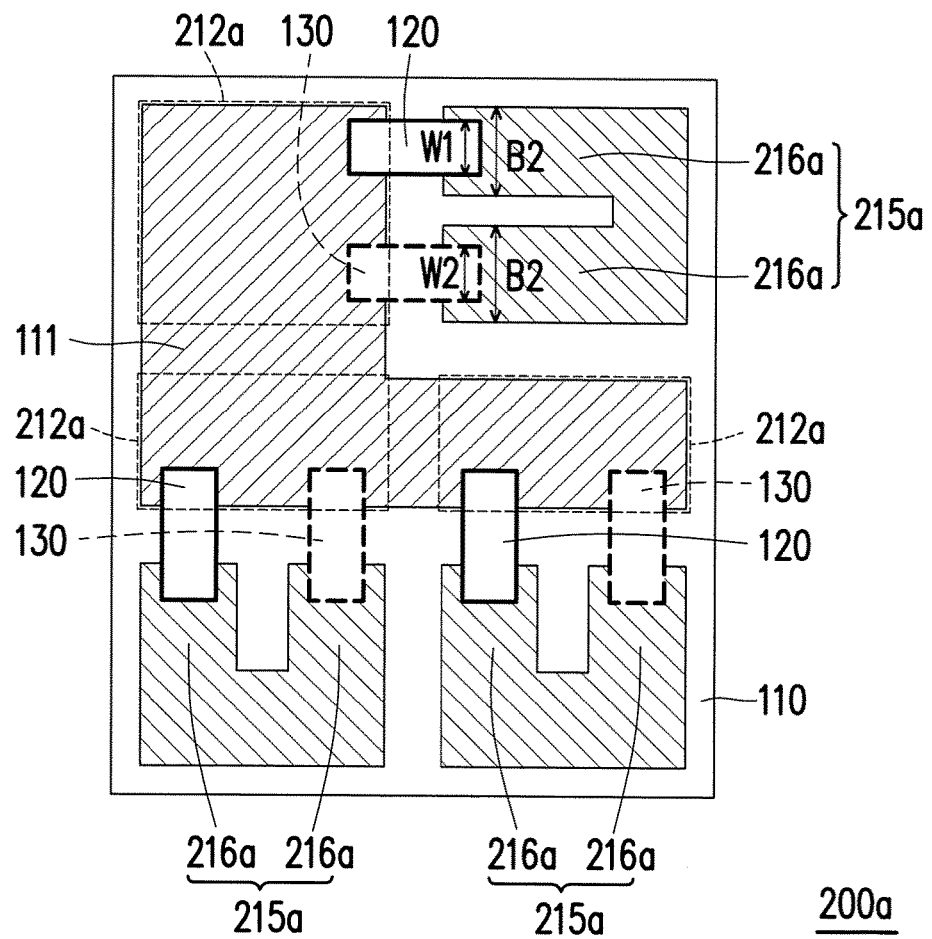
FIG. 4 is a schematic diagram of a chip package circuit board module according to another embodiment of the invention.

FIG. 4 is a schematic diagram of a chip package circuit board module according to another embodiment of the invention. Referring to FIG. 4, configuration of the first pads 212a and the second pads 215a of the chip package circuit board module 200a of FIG. 4 is similar to the configuration of the first pads 112a and the second pads 115a of the chip package circuit board module 100a of FIG. 2. A main difference between the chip package circuit board module 200a of FIG. 4 and the chip package circuit board module 100a of FIG. 2 is that the second pad 215a includes a plurality of second branch portions 216a connected to each other, the original chip 120 is connected to the first pad 212a, a position where the original chip 120 is connected to the second pad 215a is one of the second branch portions 216a, and a total width of the second pad 215a is a sum of the widths B2 of the second branch portions 216a. Similarly, when the original chip 120 cannot work, it is unnecessary to disassemble the original chip 120, but the substitution chip 130 can be directly connected to the first pad 212a and another second branch portion 216a, and the substitution chip 130 may substitute the original chip 120 to work.

Moreover, comparing the chip package circuit board module 200a of FIG. 4 with the chip package circuit board module 200 of FIG. 3, the first pad 212a does not have any branch portion, and in other embodiments, a combination that the first pad 212 has the first branch portions 213 similar to the embodiment of FIG. 3 and the second pad 115a does not have any branch portion similar to the embodiment of FIG. 2 can also be adopted, and the shapes of the first pads 212a and the second pads 215a are not limited to the aforementioned description as long as the total width of the first pad 212a is greater than twice of the width W1 of the original chip 120 and the total width of the second pad 215a is greater than twice of the width W1 of the original chip 120 and the first pad and the second pad 212a and 215a are suitable for connecting the original chip 120 and the substitution chip 130.

In summary, in the chip package circuit board module of the invention, by designing the total width P1 of the first pad of the circuit board to be greater than twice of the width W1 of the original chip, and designing the total width P2 of the second pad to be greater than twice of the width W1 of the original chip, when the original chip cannot work, the substitution chip can be directly configured beside the original chip to connect the first pad and the second pad. Namely, the first pad and the second pad respectively preserve a width for connecting the substitution chip. In this way, it is unnecessary to disassemble the original chip during rework, and working procedure of the rework is effectively simplified.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A chip package circuit board module, comprising:
   a circuit board, comprising:
      a first pad; and
      a second pad, disposed besides the first pad, and separated from the first pad;
   an original chip, connected to the first pad and the second pad, wherein a width of the original chip is W1, a total width of the first pad is P1, and a total width of the second pad is P2, the total width P1 of the first pad is larger than twice of the width W1 of the original chip, and the total width P2 of the second pad is larger than twice of the width W1 of the original chip.

2. The chip package circuit board module as claimed in claim 1, wherein the total width P1 of the first pad and the total width P2 of the second pad are respectively between 2.1 and 2.5 times of the width W1 of the original chip.

3. The chip package circuit board module as claimed in claim 1, further comprising:
   N substitution chips, connected to the first pad and the second pad in parallel with the original chip, wherein N≥1, a width of each respective substitution chip of the N substitution chips is W2, and a distance between the original chip and a closest substitution chip of the N substitution chips is D, then P1≥W1+N(W2+D), and P2≥W1+N(W2+D).

4. The chip package circuit board module as claimed in claim 3, wherein the distance D between the original chip and the closest substitution chip is between 0.1 and 0.5 times of the width W1 of the original chip.

5. The chip package circuit board module as claimed in claim 1, wherein the first pad comprises a plurality of first branch portions connected to each other, the second pad comprises a plurality of second branch portions connected to each other, a position where the original chip is connected to the first pad is one of the first branch portions, and a position where the original chip is connected to the second pad is one of the second branch portions, the total width P1 of the first pad is a sum of widths of the first branch portions, and the total width P2 of the second pad is a sum of widths of the second branch portions.

6. The chip package circuit board module as claimed in claim 5, further comprising:
   a substitution chip, connected to another one of the first branch portions and another one of the second branch portions.

7. The chip package circuit board module as claimed in claim 1, wherein the second pad comprises a plurality of second branch portions connected to each other, a position where the original chip is connected to the second pad is one of the second branch portions, and the total width P2 of the second pad is a sum of widths of the second branch portions.

8. The chip package circuit board module as claimed in claim 7, further comprising:
   a substitution chip, connected to the first pad and another one of the second branch portions.

* * * * *